(12) United States Patent
Zhou

(10) Patent No.: US 10,283,055 B2
(45) Date of Patent: May 7, 2019

(54) ORGANIC LIGHT-EMITTING DIODE DISPLAY DEVICE AND DRIVING METHOD THEREOF

(71) Applicant: EVERDISPLAY OPTRONICS (SHANGHAI) LIMITED, Shanghai (CN)

(72) Inventor: Xingyu Zhou, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 15/194,874

(22) Filed: Jun. 28, 2016

(65) Prior Publication Data

US 2017/0186379 A1    Jun. 29, 2017

(30) Foreign Application Priority Data

Dec. 29, 2015  (CN) .......................... 2015 1 1008571

(51) Int. Cl.
 *G09G 3/3291* (2016.01)
 *G09G 3/3258* (2016.01)
 (Continued)

(52) U.S. Cl.
 CPC ......... *G09G 3/3291* (2013.01); *G09G 3/3258* (2013.01); *H01L 27/3262* (2013.01);
 (Continued)

(58) Field of Classification Search
 CPC .. G09G 3/32; G09G 3/34; G09G 3/36; G09G 3/3291
 See application file for complete search history.

(56) References Cited

U.S. PATENT DOCUMENTS

2007/0080905 A1* 4/2007 Takahara ............. G09G 3/3233
 345/76
2007/0210995 A1* 9/2007 Ogura ................. G09G 3/3283
 345/76
(Continued)

FOREIGN PATENT DOCUMENTS

CN    102005178 A    4/2011
CN    104123912 A    10/2014
(Continued)

OTHER PUBLICATIONS

The Chinese 1OA issued by SIPO dated Aug. 28, 2018.

*Primary Examiner* — Olga V Merkoulova
(74) *Attorney, Agent, or Firm* — Yunling Ren

(57) ABSTRACT

The present invention discloses an organic light-emitting diode display device and a driving method thereof. The device includes: a plurality of pixels, including a plurality of organic light-emitting diodes and a plurality of drive transistors for supplying drive currents to the organic light-emitting diodes; a data driver, configured to transmit corresponding data signals to the plurality of pixels via a plurality of data lines; and a pre-charge circuit, configured to pre-charge voltage signals reserved in a previous time sequence to an initial voltage, the initial voltage being less than or equal to a minimum voltage of the data signals, wherein before the data driver transmits the corresponding data signals to the plurality of pixels, the pre-charge circuit acts to pre-charge the voltage signals reserved in the previous time sequence by the plurality of pixels to be less than or equal to the minimum voltage of the data signals.

6 Claims, 6 Drawing Sheets

(51) Int. Cl.
*H01L 27/32* (2006.01)
*H01L 27/12* (2006.01)
(52) U.S. Cl.
CPC . *H01L 27/3276* (2013.01); *G09G 2300/0809* (2013.01); *G09G 2310/0248* (2013.01); *H01L 27/124* (2013.01)

(56) References Cited

U.S. PATENT DOCUMENTS

| | | | |
|---|---|---|---|
| 2009/0195483 A1* | 8/2009 | Naugler, Jr. | G09G 3/3233 345/76 |
| 2009/0201231 A1* | 8/2009 | Takahara | G09G 3/3233 345/76 |
| 2015/0243212 A1 | 8/2015 | Lee et al. | |

FOREIGN PATENT DOCUMENTS

| | | |
|---|---|---|
| CN | 104916257 A | 9/2015 |
| CN | 105047137 A | 11/2015 |

* cited by examiner

ORGANIC LIGHT-EMITTING DIODE DISPLAY DEVICE AND DRIVING METHOD THEREOF

CROSS REFERENCE

This application is based upon and claims priority to Chinese Patent Application No. 201511008571.0, filed on Dec. 29, 2015, the entire contents thereof are incorporated herein by reference.

TECHNICAL FIELD

The present invention relates to an organic light-emitting diode (OLED) display device and a driving method thereof, and in particular, to an organic light-emitting diode display device with a simplified driving time sequence and a driving method thereof.

BACKGROUND

In recent years, a variety of tablet display devices, which overcome such defects of a cathode ray tube (CRT) as heavy weight and large size, have been developed. Such tablet display devices include liquid crystal displays (LCDs), field emission displays (FEDs), plasma display panels (PDPs), and organic light-emitting diode (OLED) displays.

In the above tablet displays, the OLED displays, which employ the organic light-emitting diodes and emit light via recombination of electrons and holes to display images, have a high response speed and are driven with a low power consumption. In addition, the OLED displays have good light-emitting efficiency, luminance and view angle, and thus have become a focus in the related field.

Generally, according to the driving method of the organic light-emitting diodes, the organic light-emitting diode displays are categorized into passive matrix organic light-emitting diodes (PMOLEDs) and active matrix organic light-emitting diodes (AMOLEDs).

A passive matrix organic light-emitting diode employs a method in which anodes and cathodes form a crossed format and the cathode lines and anode lines are selectively driven, whereas an active matrix organic light-emitting diode employs a method in which thin-film transistors and capacitors are integrated in each pixel and the voltage is maintained by the capacitors. The passive matrix organic light-emitting diode has a simple structure and a low cost, but a large-size and high-precision panel is hard to be obtained with this kind of diode. Comparatively, a large-size and high-precision panel may be obtained with the active matrix organic light-emitting diode. However, a control method of the active matrix organic light-emitting diode is hard to be implemented technically, and a relatively high cost is needed.

With respect to the resolution, contrast and operation speed, currently there is a tendency that an active matrix organic light-emitting diode (AMOLED) display in which respective unit pixels are selectively turned on or turned off is used.

As illustrated in FIG. 1, a conventional active matrix organic light-emitting diode (AMOLED) display device includes pixels P1, . . . , P6, a data driver 10, and a selector 20 including a plurality of data selection switches S1, . . . , S6. The data driver 10 transmits corresponding data signals to the pixels P1, . . . , P6 via data lines D1, . . . , D6, wherein transmission of the data signals from the data driver 10 to the pixels P1, . . . , P6 is controlled by the level waveforms of control signals SW1, . . . , SW6 of the data selection switches S1, . . . , S6. FIG. 2 is a schematic diagram of level waveforms of the control signals SW1, . . . , SW6 in FIG. 1. When the control signals SW1, . . . , SW6 stay in a low level, the data selection switches S1, . . . , S6 are switched on. In this case, the data signals output by the data driver 10 may be transmitted to the pixels P1, . . . , P6 for image display, and the pixels P1, . . . , P6 retain the voltages corresponding to the data signals. With the restriction of the features of the AMOLED, if the data signals with a high voltage output by the data driver 10 is transmitted to the pixels P1, . . . , P6 in a previous image display segment, then the data signals with a low voltage output by the data driver 10 cannot be transmitted to the pixels P1, . . . , P6 in a next image display segment. To prevent the problem that the data cannot be written into the pixels, a low voltage needs to be pre-charged before an image is displayed. At present, pre-charging low voltage is implemented and controlled by adjusting the level waveforms of the control signals SW1, . . . , SW6 and the level waveforms of the data signals output by the data driver 10. As illustrated in FIG. 2, before the data driver 10 transmits the data signals to the pixels P1, . . . , P6, all the data selection switches S1, . . . , S6 are controlled to be switched on by maintaining the control signals SW1, . . . , SW6 all in a low level, and the data driver 10 is controlled to simultaneously output a low voltage to implement the pre-charging of low voltage. However, the time sequence of the data signals output by the data driver 10 and the time sequence of the control signals of the data selection switches S1, . . . , S6 are complicated, which increases the power consumption of the data driver 10.

SUMMARY

In view of the defect in the related art, an object of the present invention is to provide an organic light-emitting diode display device with simple time sequence design and a driving method thereof.

To achieve the above object, the present invention provides an organic light-emitting diode display device, including:

a plurality of pixels, including a plurality of organic light-emitting diodes and a plurality of drive transistors for supplying drive currents to the organic light-emitting diodes;

a data driver, configured to transmit corresponding data signals to the plurality of pixels via a plurality of data lines; and a pre-charge circuit, configured to pre-charge voltage signals reserved in a previous time sequence to an initial voltage, the initial voltage being less than or equal to a minimum voltage of the data signals;

wherein before the data driver transmits the corresponding data signals to the plurality of pixels, the pre-charge circuit acts to pre-charge the voltage signals reserved in the previous time sequence by the plurality of pixels to be less than or equal to the minimum voltage of the data signals.

Further, the pre-charge circuit includes:

a plurality of first switch elements, arranged on the plurality of data lines between the data driver and the plurality of pixels.

Further, the plurality of data lines between the data driver and the plurality of pixels are correspondingly provided with the plurality of first switch elements.

Further, any one of the plurality of first switch elements includes a control terminal and a first terminal, the control terminal receiving a first control signal for controlling switch-on or switch-off of the first switch element, the first terminal being connected to the initial voltage.

Further, before the data driver transmits the corresponding data signals to the plurality of pixels, the control terminals of the plurality of first switch elements receive the first control signal, and the initial voltage connected to the first terminals of the plurality of first switch elements is written into the plurality of pixels.

Further, in the organic light-emitting diode display device, the number of the plurality of pixels is n, the number of the plurality of data lines is n, and the number of the plurality of first switch elements is n−1.

Further, the data driver sequentially transmits the corresponding data signals to the plurality of pixels via the plurality of data lines.

Further, the n−1 first switch elements are correspondingly arranged on the n−1 data lines, and the data driver firstly transmits the data signals to the corresponding pixels via the data line on which the first switch element is not arranged.

Further, the light-emitting diode display device further includes a selector, wherein the selector includes a plurality of second switch elements connected to the plurality of data lines, the plurality of second switch elements being arranged on the plurality of data lines between the data driver and the plurality of first switch elements.

Further, any one of the plurality of second switch elements includes a control terminal and a first terminal, the control terminal of the second switch element receiving a second control signal for controlling switch-on or switch-off of the second switch element, the first terminal of the second switch element receiving the data signals.

Further, the data driver sequentially controls the plurality of second switch elements to switch on according to the second control signal, to sequentially transmit the corresponding data signals to the plurality of pixels.

Further, the first control signal of the n−1 first switch elements is the same as the second control signal of the firstly switched-on second switch element.

The present invention further provides a driving method of an organic light-emitting diode display device, wherein the organic light-emitting diode display device includes: a plurality of pixels, including a plurality of organic light-emitting diodes and a plurality of drive transistors for supplying drive currents to the organic light-emitting diodes; a data driver, configured to transmit corresponding data signals to the plurality of pixels via a plurality of data lines; and a pre-charge circuit, configured to pre-charge voltage signals reserved in a previous time sequence to an initial voltage, the initial voltage being less than or equal to a minimum voltage of the data signals; wherein the method includes the following steps:

before the data driver transmits the corresponding data signals to the plurality of pixels, controlling the pre-charge circuit to act to pre-charge the voltage signals reserved in the previous time sequence by the plurality of pixels to be less than or equal to the minimum voltage of the data signals.

Further, before the data driver transmits the corresponding data signals to the plurality of pixels, the controlling the pre-charge circuit to act includes:

receiving a first control signal by a plurality of first switch elements of the pre-charge circuit such that the first switch elements are switched on, and writing the initial voltage into the plurality of pixels.

Further, the organic light-emitting diode display device further includes a selector, wherein a plurality of second switch elements of the selector receive a second control signal such that the plurality of second switch elements are switched on, to transmit corresponding data signals to the plurality of pixels via the data driver.

According to the present invention, a drive voltage resident in pixels may be pulled down by using a pre-charge circuit, such that a voltage of data signals is greater than a drive voltage resident in a previous time sequence, so as to prevent abnormal display. In addition, the present invention achieves the effects of simplifying time sequence design and reducing power consumption of the data driver.

BRIEF DESCRIPTION OF THE DRAWINGS

The present invention and the advantages thereof would be better understood with reference to the detailed description given in conjunction with the accompanying drawings hereinafter. With such detailed description, the present invention and the advantages thereof would become more apparent easily. In the drawings, like reference signs denote like or similar elements.

DETAILED DESCRIPTION

Hereinafter, the present invention will be described in detail with reference to the accompanying drawings, which illustrate exemplary embodiments of the present invention. A person skilled in the art would recognize that the embodiments described herein may be modified in various manners without departing from the spirit or scope of the present invention.

Elements having the same structure in all the exemplary embodiments are denoted by the same reference signs, and are described in the first embodiment of the present invention. In other embodiments, only elements other than the same elements are described.

In addition, for a clear description of the present invention, portions irrelevant to the description are omitted, and in the whole specification, like reference signs denote like or similar elements.

In the whole specification and the appended claims, when it is depicted that one element is "connected" to another element, the element may be "directly connected" to the another element or "electrically connected" to the another element via a third element. Further, unless contrary description is clearly given, the term "comprise" or "include" and its variations shall be understood as including all the described elements, but not excluding other possible elements.

Figure 1:
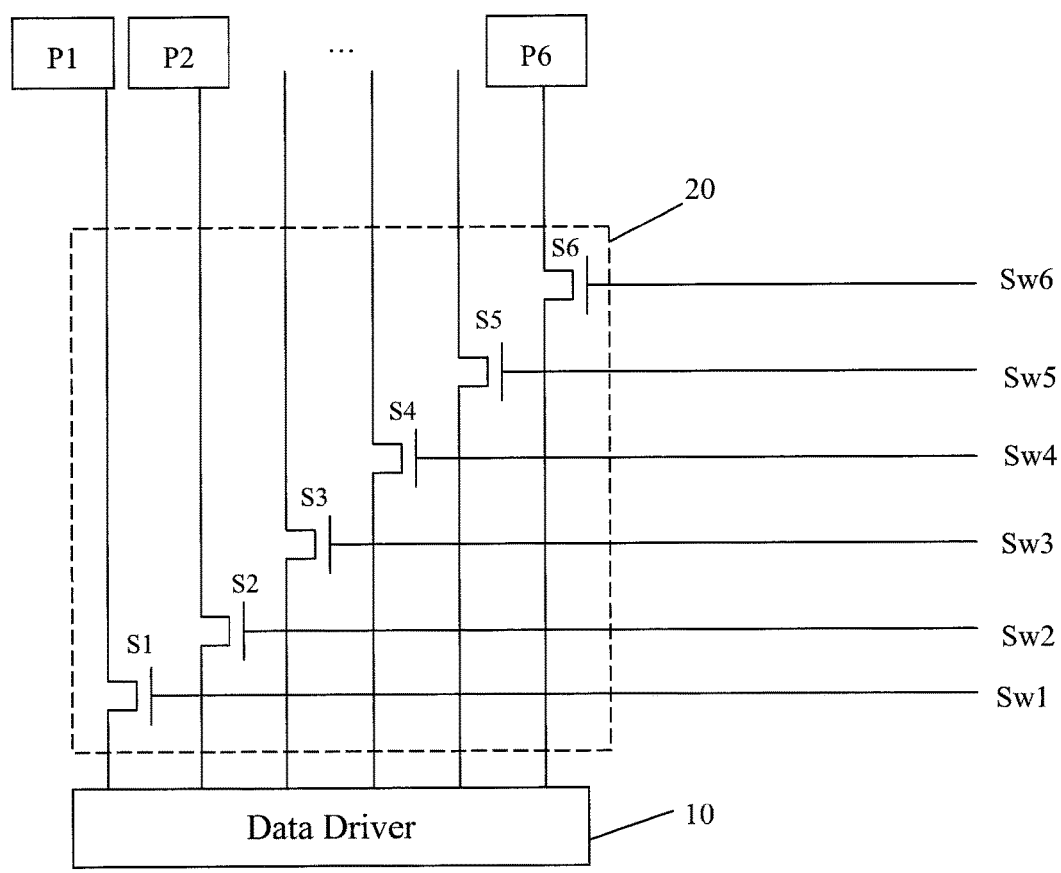
FIG. 1 is a structural block diagram of an organic light-emitting diode display device in the prior art.
Figure 2:
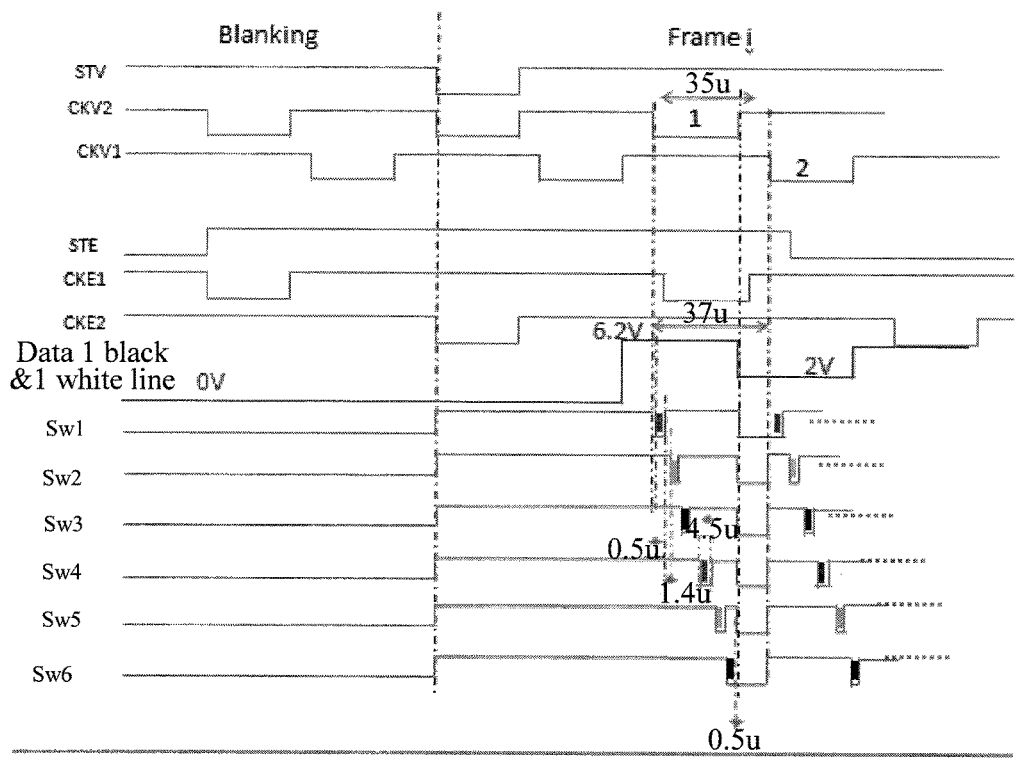
FIG. 2 is a diagram of drive waveforms supplied to a data driver and a selector in the organic light-emitting diode display device in the prior art.
Figure 3:
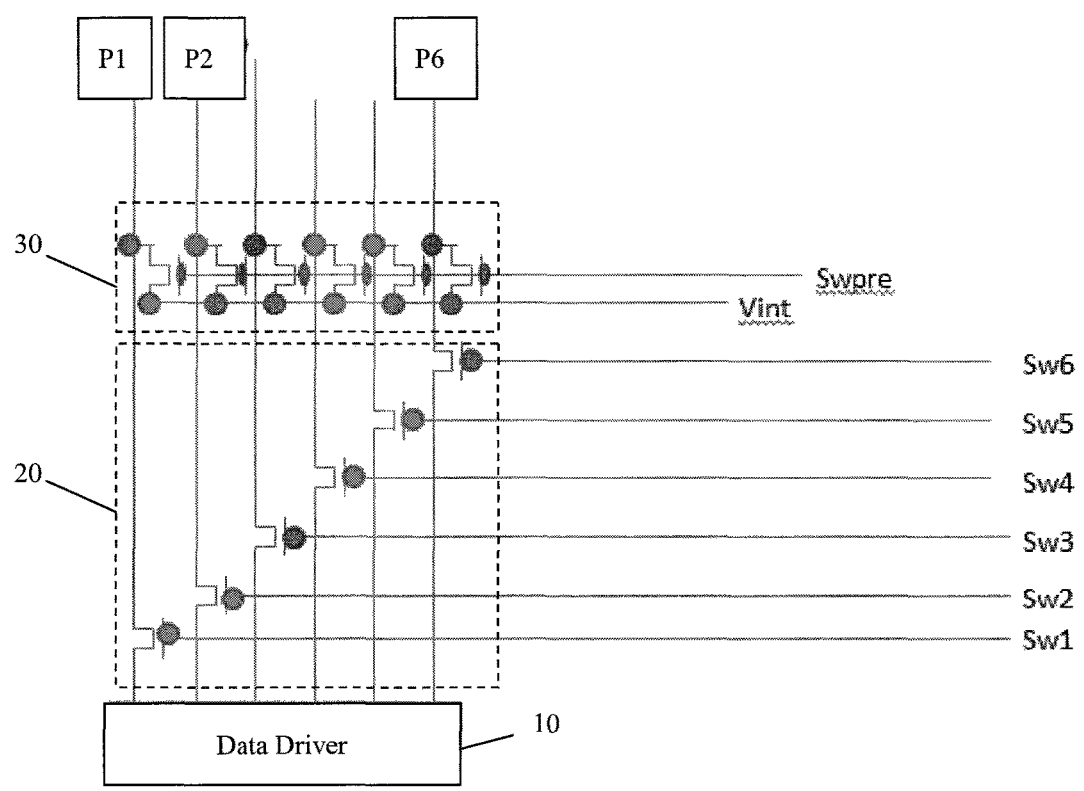
FIG. 3 is a block diagram of an organic light-emitting diode display device according to an exemplary embodiment of the present invention.

FIG. 3 is a block diagram of an organic light-emitting diode display device according to an exemplary embodiment of the present invention.

As illustrated in FIG. 3, the organic light-emitting diode display device includes a data driver 10, a selector 20, a plurality of pixels P1, P2, . . . , P6, and a pre-charge circuit 30.

The data driver 10 has a plurality of output terminals, and a plurality of paths of data signals are output via the plurality of output terminals. The plurality of output terminals of the data driver 10 are connected to a plurality of data lines. Description is given by using connection to six data lines D1, D2, . . . , D6 as an example. The six data lines D1, D2, . . . , D6 are correspondingly connected to six paths of outputs of the data driver 10, and six paths of data signals output by the six output terminals of the data driver 10 are transmitted through the six data lines.

The selector 20 includes six selection switches S1, S2, . . . , S6 connected to the six data lines D1, D2, . . . , D6, the number of selection switches is the same as the number of data lines, and each data line is correspondingly provided with one selection switch. Each of the selection switches S1, S2, . . . , S6 has an input terminal, an output terminal and a control terminal. The input terminals of the selection switches S1, S2, . . . , S6 are coupled to the six paths of outputs of the data driver 10, and receive the six paths of data signals from the data driver 10. The output terminals of the selection switches S1, S2, . . . , S6 are coupled to the corresponding six pixels P1, P2, . . . , P6 respectively. The selector 20 may receive a selection drive control signal from a time sequence controller, to generate pulse selection signals Sw1, Sw2, . . . , Sw6 for respectively controlling switch-on or switch-off operations of the data selection switches S1, S2, . . . , S6. The pulse selection signals Sw1, Sw2, . . . , Sw6 are correspondingly connected to the control terminals of the selection switches S1, S2, . . . , S6 respectively. Switch-on and switch-off of the selection switches S1, S2, . . . , S6 may be controlled according to pulse waveforms of the pulse selection signals Sw1, Sw2, . . . , Sw6. The selection switches S1, S2, . . . , S6 are sequentially switched on during the period in which the display device displays images, such that data signals output by the data driver 10 are transmitted to the data lines D1, D2, . . . , D6. That is, the data selection switches S1, S2, . . . , S6 are switched on in this order during image displaying. Since the data selection switches S1, S2, . . . , S6 are switched on by the pulse selection signals Sw1, Sw2, . . . , Sw6 during image displaying, pixels included in predefined pixel rows in the pixels P1, P2, . . . , P6 emit light according to drive currents induced by the data signals transmitted by the corresponding data lines.

Figure 4:
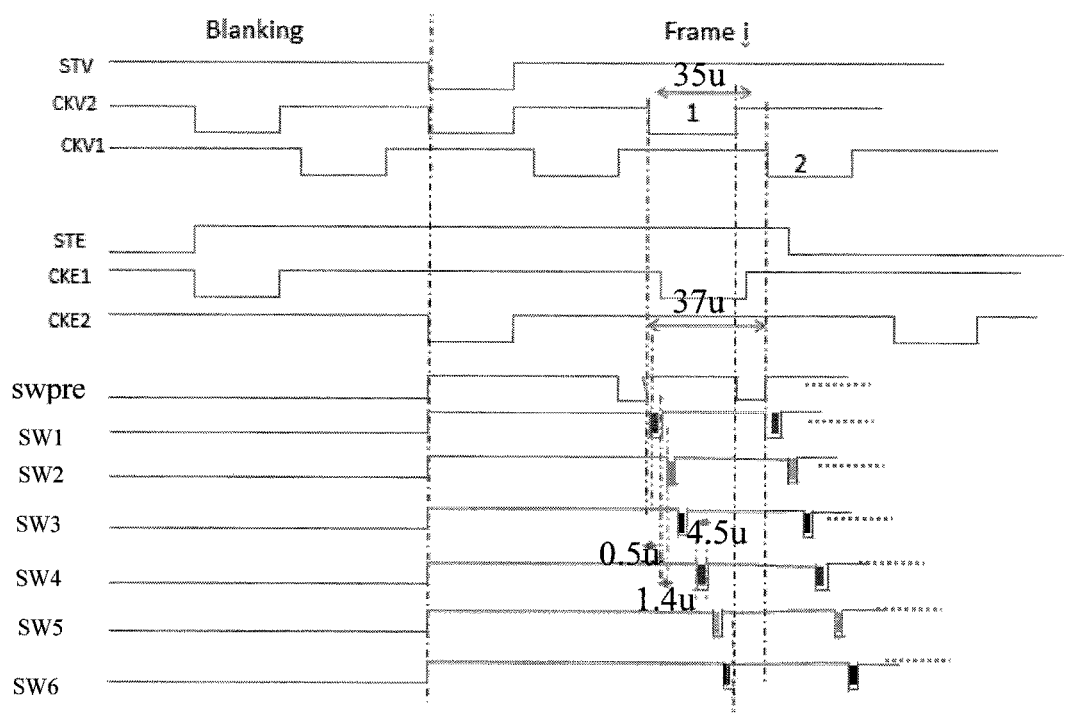
FIG. 4 is a diagram of drive waveforms supplied to a selector and a pre-charge circuit in the organic light-emitting diode display device according to an exemplary embodiment of the present invention.

FIG. 4 illustrates a time sequence of pulse waveforms of the pulse selection signals Sw1, Sw2, . . . , Sw6. As illustrated in FIG. 4, the pulse selection signal Sw1 firstly becomes to stay in a low level, and at this time, the pulse selection signals Sw2, . . . , Sw6 stay in a high level, and the selection switch S1 stays in a switch-on state. The selection switches S2, . . . , S6 stay in a switch-off state. The first path of data signal output by the data driver 10 is transmitted via the data line D1 and the selection switch S1 to the pixel P1 for image display. Afterwards, the pulse selection signal Sw2 becomes to stay in a low level, and at this time, the pulse selection signals Sw1, Sw3, Sw4, Sw5 and Sw6 stay in a high level, and the selection switch S2 stays in a switch-on state. The selection switches S1, S3, S4, S5 and S6 stay in a switch-off state. The second path of data signal output by the data driver 10 is transmitted via the data line D2 and the selection switch S2 to the pixel P2 for image display. Analogously, such process is conducted until the selection switch S6 becomes to stay in a switch-on state, and the sixth path of data signal output by the data driver 10 is transmitted via the data line D6 and the selection switch S6 to the pixel P6 for image display. The above description is given by using the scenario where the selection switches are controlled to be switched on when the pulse selection signals stay in a low level. It may be envisaged that the description may also be given by using the scenario where the selection switches are controlled to be switched on when the pulse selection signals stay in a high level. The selection switches S1, S2, . . . , S6 may be transistors, and in this case, the pulse selection signals Sw1, Sw2, . . . , Sw6 are connected to gate electrodes of corresponding transistors respectively.

The pre-charge circuit 30 includes switch elements N1, N2, . . . , N6. Each of the switch elements N1, N2, . . . , N6 has an input terminal, an output terminal and a control terminal. The input terminals of the switch elements N1, N2, . . . , N6 are connected together with each other, and are connected to an existing initial voltage Vint, wherein the initial voltage Vint is less than or equal to a minimum data voltage Vdata corresponding to the data signals. The output terminals of the switch elements N1, N2, . . . , N6 are respectively connected to the data lines D1, D2, . . . , D6 between the selector 20 and the pixels P1, P2, . . . , P6. The control terminals of the switch elements N1, N2, . . . , N6 are connected together with each other, and are connected to a pulse pre-charge signal Swpre. The switch elements N1, N2, . . . , N6 may be controlled to be simultaneously switched on or switched off according to the pulse waveform of the pulse pre-charge signal Swpre. For example, when the pulse pre-charge signal Swpre stays in a low level, the switch elements N1, N2, . . . , N6 are simultaneously switched on; and when the pulse pre-charge signal Swpre stays in a high level, the switch elements N1, N2, . . . , N6 are simultaneously switched off.

Referring to the pulse pre-charge signal Swpre and the pulse selection signals Sw1, Sw2, Sw3, Sw4, Sw5 and Sw6 as illustrated in FIG. 4, before image display, a low level is applied to the pulse pre-charge signal Swpre, and meanwhile a high level is applied to the pulse selection signals Sw1, Sw2, Sw3, Sw4, Sw5 and Sw6. In this case, the switch elements N1, N2, . . . , N6 are all switched on, and the initial voltage Vint connected from the input terminals of the switch elements N1, N2, . . . , N6 is firstly written, that is, the initial voltage Vint is respectively pre-charged to the output terminal of the switch elements S1, S2, . . . , S6. Upon completion of pre-charging, a low level is sequentially applied to the pulse selection signals Sw1, Sw2, Sw3, Sw4, Sw5 and Sw6. Since the pre-charged initial voltage Vint is less than or equal to the minimum data voltage Vdata corresponding to the data signals transmitted by the data driver 10, it may be ensured that the data signals transmitted by the data driver 10 are written into the pixels, thereby preventing abnormal display. In addition, there is no need to regulate the waveforms of the pulse selection signals of the selection switches and the pulse waveforms of the data signals output by the data driver. To be specific, before image display, there is no need to frequently pull down the pulse waveforms of the data signals output by the data driver and the waveforms of the pulse selection signals of the selection switches. This greatly simplifies control of the time sequence and reduces the power consumption of the data driver.

Figure 5:
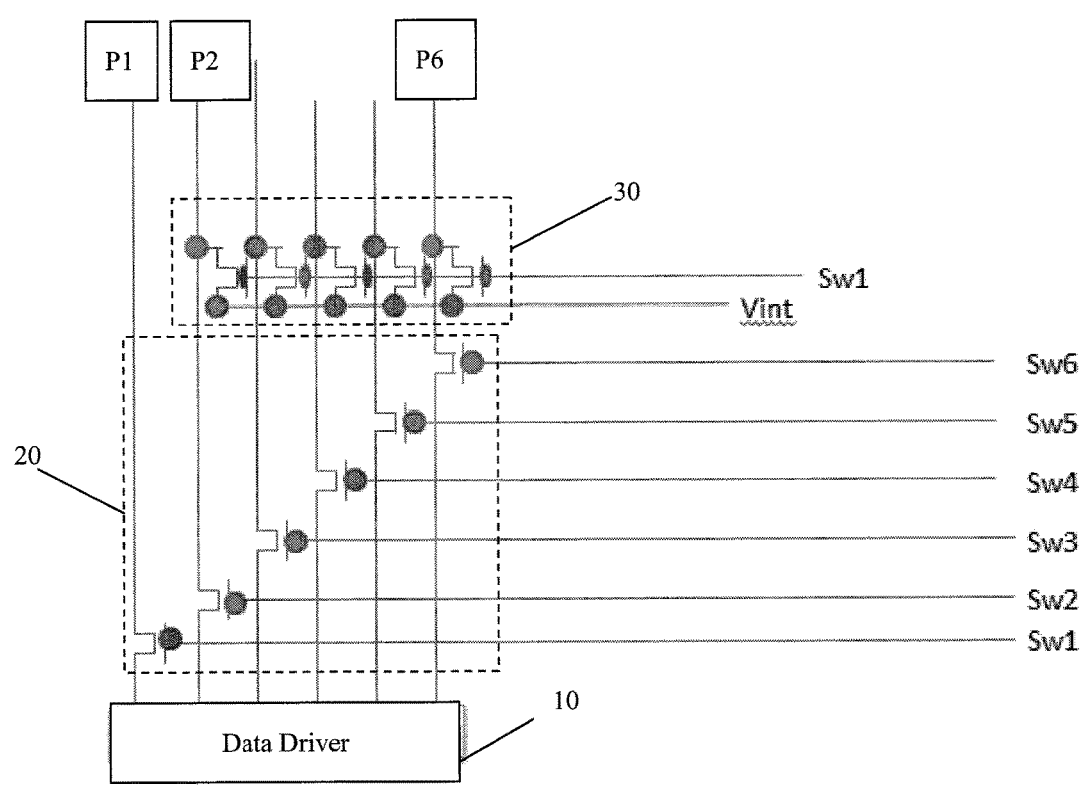
FIG. 5 is a block diagram of an organic light-emitting diode display device according to another exemplary embodiment of the present invention.

FIG. 5 is a block diagram of an organic light-emitting diode display device according to an exemplary embodiment of the present invention.

As illustrated in FIG. 5, the organic light-emitting diode display device includes a data driver 10, a selector 20, a plurality of pixels P1, P2, . . . , P6, and a pre-charge circuit 30.

The data driver 10 has a plurality of output terminals, and a plurality of paths of data signals are output via the plurality of output terminals. The plurality of output terminals of the data driver 10 are connected to a plurality of data lines. Description is given by using connection to six data lines D1, D2, . . . , D6 as an example. The six data lines D1, D2, . . . , D6 are correspondingly connected to six paths of outputs of the data driver 10, and six paths of data signals output by the six output terminals of the data driver 10 are transmitted through the six data lines.

The selector 20 includes six selection switches S1, S2, . . . , S6 connected to the six data lines D1, D2, . . . , D6, the number of selection switches is the same as the number of data lines, and each data line is correspondingly provided with one selection switch. Each of the selection switches S1, S2, . . . , S6 has an input terminal, an output terminal and a control terminal. The input terminals of the selection switches S1, S2, . . . , S6 are coupled to the six paths of outputs of the data driver 10, and receive the six paths of data signals from the data driver 10. The output terminals of the selection switches S1, S2, . . . , S6 are coupled to the corresponding six pixels P1, P2, . . . , P6 respectively. The selector 20 may receive a selection drive control signal from a time sequence controller, to generate pulse selection signals Sw1, Sw2, . . . , Sw6 for respectively controlling switch-on or switch-off operations of the data selection switches S1, S2, . . . , S6. The pulse selection signals Sw1, Sw2, . . . , Sw6 are correspondingly connected to the control terminals of the selection switches S1, S2, . . . , S6 respectively. Switch-on and switch-off of the selection switches S1, S2, . . . , S6 may be controlled according to pulse waveforms of the pulse selection signals Sw1, Sw2, . . . , Sw6. The selection switches S1, S2, . . . , S6 are sequentially switched on during the period in which the display device displays images, such that data signals output by the data driver 10 are transmitted to the data lines D1, D2, . . . , D6. That is, the data selection switches S1, S2, . . . , S6 are switched on in this order during image displaying. Since the data selection switches S1. S2, . . . , S6 are switched on by the pulse selection signals Sw1, Sw2, Sw6 during image displaying, pixels P1, P2, . . . , P6 emit light according to drive currents induced by the data signals transmitted by the corresponding data lines.

Figure 6:
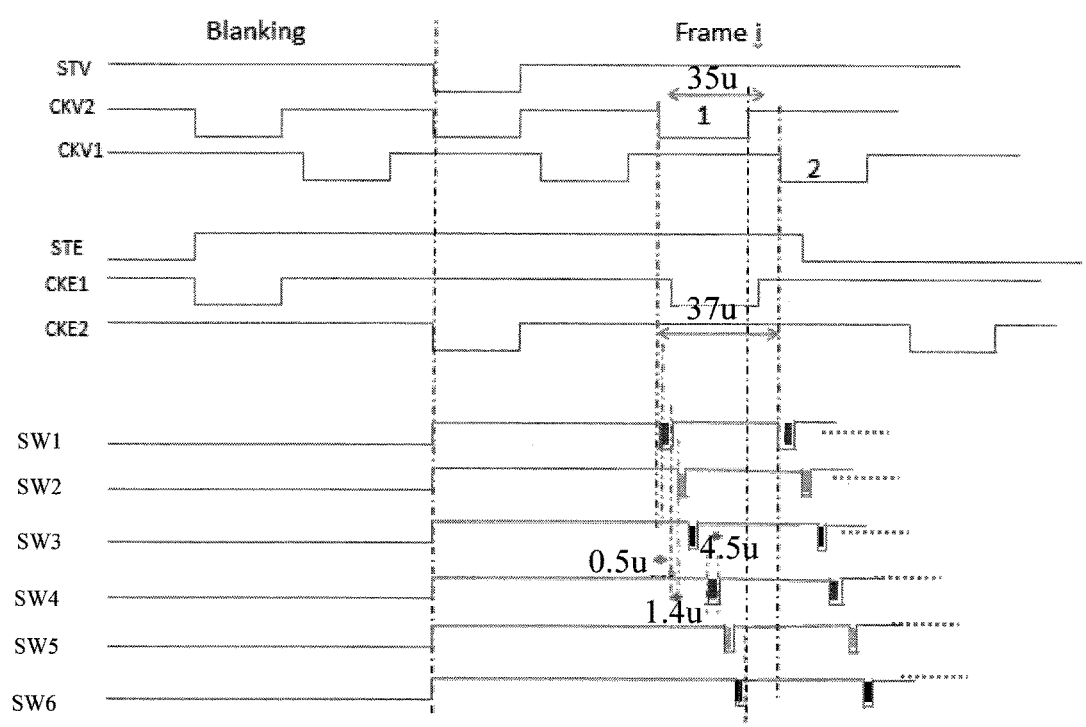
FIG. 6 is a diagram of drive waveforms supplied to a selector and a pre-charge circuit in the organic light-emitting diode display device according to another exemplary embodiment of the present invention.

FIG. 6 illustrates a time sequence of pulse waveforms of the pulse selection signals Sw1, Sw2, . . . , Sw6. As illustrated in FIG. 6, the pulse selection signal Sw1 firstly becomes to stay in a low level, and at this time, the pulse selection signals Sw2, . . . , Sw6 stay in a high level, and the selection switch S1 stays in a switch-on state. The selection switches S2, . . . , S6 stay in a switch-off state. The first path of data signal output by the data driver 10 is transmitted via the data line D1 and the selection switch S1 to the pixel P1 for image display. Afterwards, the pulse selection signal Sw2 becomes to stay in a low level, and at this time, the pulse selection signals Sw1 Sw3, Sw4, Sw5 and Sw6 stay in a high level, and the selection switch S2 stays in a switch-on state. The selection switches S1, S3, S4, S5 and S6 stay in a switch-off state. The second path of data signal output by the data driver 10 is transmitted via the data line D2 and the selection switch S2 to the pixel P2 for image display. Analogously, such process is conducted until the selection switch S6 stays in a switch-on state, and the sixth path of data signal output by the data driver 10 is transmitted via the data line D6 and the selection switch S6 to the pixel P6 for image display. The above description is given by using the scenario where the selection switches are controlled to be switched on when the pulse selection signals stay in a low level. It may be envisaged that the description may also be given by using the scenario where the selection switches are controlled to be switched on when the pulse selection signals stay in a high level and are controlled to be switched off when the pulse selection signals stay in a low level. For example, the selection switches S1, S2, . . . , S6 may be PMOS or NMOS transistors, and in this case, the pulse selection signals Sw1, Sw2, . . . , Sw6 are connected to gate electrodes of corresponding transistors respectively. The conduction features and types of the above selection switches are only used for illustration purpose, which are not intended to limit the present invention.

The pre-charge circuit 30 includes switch elements N1, N2, . . . , N5. Each of the switch elements N1, N2, . . . , N5 has an input terminal, an output terminal and a control terminal. The input terminals of the switch elements N1, N2, . . . , N5 are connected together with each other, and are connected to an existing initial voltage Vint, wherein the initial voltage Vint is less than or equal to a minimum data voltage Vdata corresponding to the data signals. The output terminals of the switch elements N1, N2, . . . , N5 are respectively connected to the data lines D2, D3, . . . , D6 between the selector 20 and the pixels P2, P3, . . . , P6. The control terminals of the switch elements N1, N2, . . . , N5 are connected together with each other, and connected to a pulse selection signal Sw1 which is the same as that of the control terminal of the selection switch S1. The switch elements N1, N2, . . . , N5 may be controlled to be simultaneously switched on or switched off according to the pulse waveform of the pulse selection signal Sw1. For example, when the pulse selection signal Sw1 stays in a low level, the switch elements N1, N2, . . . , N5 are simultaneously switched on; and when the pulse selection signal Sw1 stays in a high level, the switch elements N1, N2, . . . , N5 are simultaneously switched off. Similarly, the selection switches N1, N2, . . . , N5 may also be switched on when the pulse selection signal Sw1 stays in a high level, and switched off when the pulse selection signal Sw1 stays in a low level. The switch elements N1, N2, . . . , N5 may also be PMOS or NMOS transistors, and the switch elements N1, N2, . . . , N5 may be controlled to be simultaneously switched on or switched off by using one pulse selection signal Sw1. The conduction features and types of the above switch elements are only used for illustration purpose, which are not intended to limit the present invention.

Referring to the pulse selection signals Sw1, Sw2, Sw3, Sw4, Sw5 and Sw6 as illustrated in FIG. 6, during image display, when the pulse selection signal Sw1 firstly becomes to stay in a low level, the selection switch S1 is firstly switched on, and a correct data voltage output by the data driver will be directly written into the pixel P1, with no need of pre-charging. In the mean time, under the constraint that the selection signal Sw1 stays in a low level, the switch elements N1, N2, . . . , N5 are simultaneously switched on, such that an initial voltage Vint is pre-charged to the pixels P2, P3, . . . , P6. The initial voltage Vint is an initialized voltage which is inherently needed by the pixels of an AMOLED, and the initial voltage is even less than the minimum data voltage. In this way, it is ensured that a subsequently written correct voltage is greater than Vint, and that a correct data voltage is written into the pixels P2, P3, . . . , P6, thereby preventing abnormal display.

This embodiment differs from the embodiment illustrated in FIG. 3 mainly in that the number of used switch elements is reduced, no switch element for pre-charging is disposed at the rear end of the firstly switched-on selection switch, and the existing pulse selection signal Sw1 is used to control the switch elements N1, N2, . . . , N5 to be switched on or switched off to pre-charge the pixels P2, P3, . . . , P6. Therefore, the present embodiment further simplifies the pre-charge circuit and reduces the cost, in addition to the advantages of simplifying control of the time sequence and reducing the power consumption of the data driver.

The number of selection switches, the number of switch elements for pre-charging, and the number of pixels in the above embodiments are merely for illustration purpose, but are not intended to limit the present invention.

The present invention further exemplarily illustrates a driving method of an organic light-emitting diode display device, wherein the organic light-emitting diode display device has been described in detail as above, and is thus not described herein any further. The driving method includes the following steps:

before the data driver transmits the corresponding data signals to the plurality of pixels, controlling the pre-charge circuit to act to pre-charge the voltage signals reserved in the previous time sequence by the plurality of pixels to be less than or equal to the minimum voltage of the data signals. That is, before the data driver transmits the data signals to the pixels for image display, firstly an initial voltage is pre-charged to the pixels, to ensure that the data voltage corresponding to the data signals transmitted by the data driver is greater than or equal to the initial voltage, such that the data signals may be normally written into the pixels and abnormal display is prevented.

Detailed above are exemplary embodiments of the present invention. It shall be understood that the present invention is not limited to the specific structures, configuration manners or implementation methods described herein. Instead, the present invention is intended to cover various modifications and equivalent arrangements within the spirit and scope of the appended claims.

What is claimed is:

1. An organic light-emitting diode display device, comprising:
   a plurality of pixels, comprising a plurality of organic light-emitting diodes and a plurality of drive transistors for supplying drive currents to the organic light-emitting diodes;
   a data driver, configured to transmit corresponding data signals to the plurality of pixels via a plurality of data lines; and
   a pre-charge circuit, configured to pre-charge voltage signals reserved in a previous time sequence to an initial voltage, the initial voltage being less than or equal to a minimum voltage of the data signals;
   wherein before the data driver transmits the corresponding data signals to the plurality of pixels, the pre-charge circuit acts to pre-charge the voltage signals reserved in the previous time sequence by the plurality of pixels to be less than or equal to the minimum voltage of the data signals; and
   wherein the pre-charge circuit comprises: a plurality of first switch elements, arranged on the plurality of data lines between the data driver and the plurality of pixels;

the plurality of data lines between the data driver and the plurality of pixels are correspondingly provided with the plurality of first switch elements;
   any one of the plurality of first switch elements comprises a control terminal and a first terminal, the control terminal receiving a first control signal for controlling switch-on or switch-off of the first switch elements, the first terminal being connected to the initial voltage;
   before the data driver transmits the corresponding data signals to the plurality of pixels, the control terminal of the plurality of first switch elements receives the first control signal, and the initial voltage connected to the first terminals of the plurality of first switch elements is written into the plurality of pixels;
   wherein the organic light-emitting diode display device further comprises a selector, wherein the selector comprises a plurality of second switch elements connected to the plurality of data lines, the plurality of second switch elements being arranged on the plurality of data lines between the data driver and the plurality of first switch elements;
   wherein any one of the plurality of second switch elements comprises a control terminal and a first terminal, the control terminal of the second switch element receiving a second control signal for controlling switch-on or switch-off of the second switch element, the first terminal of the second switch element receiving the data signals; and
   the data driver sequentially controls the plurality of second switch elements to switch on according to the second control signal, to sequentially transmit the corresponding data signals to the plurality of pixels.

2. The organic light-emitting diode display device according to claim 1, wherein the number of the plurality of pixels is n, the number of the plurality of data lines is n, and the number of the plurality of first switch elements is n−1.

3. The organic light-emitting diode display device according to claim 2, wherein the data driver sequentially transmits the corresponding data signals to the plurality of pixels via the plurality of data lines.

4. The organic light-emitting diode display device according to claim 3, wherein the n−1 first switch elements are correspondingly arranged on the n−1 data lines, and the data driver firstly transmits the data signals to the corresponding pixels via the data line on which the first switch element is not arranged.

5. The organic light-emitting diode display device according to claim 1, wherein the first control signal of the n−1 first switch elements is the same as the second control signal of the firstly switched-on second switch element.

6. A driving method of an organic light-emitting diode display device, wherein the organic light-emitting diode display device comprises: a plurality of pixels, comprising a plurality of organic light-emitting diodes and a plurality of drive transistors for supplying drive currents to the organic light-emitting diodes; a data driver, configured to transmit corresponding data signals to the plurality of pixels via a plurality of data lines; and a pre-charge circuit, configured to pre-charge voltage signals reserved in a previous time sequence to an initial voltage, the initial voltage being less than or equal to a minimum voltage of the data signals; wherein the method comprises the following steps:

before the data driver transmits the corresponding data signals to the plurality of pixels, controlling the pre-charge circuit to act to pre-charge the voltage signals reserved in the previous time sequence by the plurality of pixels to be less than or equal to the minimum voltage of the data signals;

wherein the pre-charge circuit comprises: a plurality of first switch elements, arranged on the plurality of data lines between the data driver and the plurality of pixels;

the plurality of data lines between the data driver and the plurality of pixels are correspondingly provided with the plurality of first switch elements;

any one of the plurality of first switch elements comprises a control terminal and a first terminal, the control terminal receiving a first control signal for controlling switch-on or switch-off of the first switch elements, the first terminal being connected to the initial voltage;

before the data driver transmits the corresponding data signals to the plurality of pixels, the control terminal of the plurality of first switch elements receives the first control signal, and the initial voltage connected to the first terminals of the plurality of first switch elements is written into the plurality of pixels;

wherein the organic light-emitting diode display device further comprises a selector, wherein the selector comprises a plurality of second switch elements connected to the plurality of data lines, the plurality of second switch elements being arranged on the plurality of data lines between the data driver and the plurality of first switch elements;

wherein any one of the plurality of second switch elements comprises a control terminal and a first terminal, the control terminal of the second switch element receiving a second control signal for controlling switch-on or switch-off of the second switch element, the first terminal of the second switch element receiving the data signals; and the data driver sequentially controls the plurality of second switch elements to switch on according to the second control signal, to sequentially transmit the corresponding data signals to the plurality of pixels.

* * * * *